United States Patent
Endo et al.

(10) Patent No.: US 10,676,587 B2
(45) Date of Patent: Jun. 9, 2020

(54) HEAT CONDUCTIVE SHEET

(71) Applicant: SHIN-ETSU CHEMICAL CO., LTD., Tokyo (JP)

(72) Inventors: Akihiro Endo, Annaka (JP); Yasuhisa Ishihara, Annaka (JP); Toru Tsuchiya, Annaka (JP); Hisaharu Yamaguchi, Annaka (JP); Masahiro Moteki, Annaka (JP); Takahiro Maruyama, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/316,901

(22) PCT Filed: Jun. 9, 2017

(86) PCT No.: PCT/JP2017/021498
§ 371 (c)(1),
(2) Date: Jan. 10, 2019

(87) PCT Pub. No.: WO2018/020862
PCT Pub. Date: Feb. 1, 2018

(65) Prior Publication Data
US 2019/0233612 A1 Aug. 1, 2019

(30) Foreign Application Priority Data
Jul. 26, 2016 (JP) .................. 2016-145990

(51) Int. Cl.
C08K 3/22 (2006.01)
B32B 27/06 (2006.01)
B32B 27/12 (2006.01)
B32B 27/20 (2006.01)
B32B 27/28 (2006.01)
C08K 7/00 (2006.01)
C08L 83/06 (2006.01)
H01L 23/373 (2006.01)
B32B 5/28 (2006.01)
H05K 7/20 (2006.01)
H01L 23/36 (2006.01)
B32B 27/00 (2006.01)

(52) U.S. Cl.
CPC .................. C08K 3/22 (2013.01); B32B 5/28 (2013.01); B32B 27/00 (2013.01); B32B 27/06 (2013.01); B32B 27/12 (2013.01); B32B 27/20 (2013.01); B32B 27/283 (2013.01); C08K 7/00 (2013.01); C08L 83/06 (2013.01); H01L 23/36 (2013.01); H01L 23/3737 (2013.01); H05K 7/20 (2013.01); B32B 2262/101 (2013.01); B32B 2264/102 (2013.01); B32B 2307/302 (2013.01); B32B 2457/00 (2013.01); C08K 2003/2227 (2013.01); C08K 2201/001 (2013.01); C08L 2203/20 (2013.01); C08L 2205/025 (2013.01); C08L 2205/03 (2013.01); C08L 2205/035 (2013.01)

(58) Field of Classification Search
CPC ...... C08K 3/22; C08K 7/00; C08K 2201/001; C08K 2003/2227; C08K 2201/006; C08K 2201/005; H01L 23/3737; H01L 23/36; B32B 27/283; B32B 27/12; B32B 27/06; B32B 27/00; B32B 5/28; B32B 27/28; B32B 17/064; B32B 17/04; C08L 83/06; C08L 2205/035; C08L 2205/03; C08L 2205/025; C08L 2203/20; C08L 83/04; H05K 7/20; H05K 7/20481
See application file for complete search history.

(56) References Cited

U.S. PATENT DOCUMENTS

| 5,130,113 A * | 7/1992 | Kitayama | C01F 7/023 423/629 |
| 2017/0198188 A1* | 7/2017 | Ishihara | C08K 7/18 |

FOREIGN PATENT DOCUMENTS

| JP | 1-173514 A | 7/1989 | |
| JP | 01173514 A * | 7/1989 | ............. H01B 17/60 |
| JP | 2-199020 A | 8/1990 | |
| JP | 6-155517 A | 6/1994 | |
| JP | 06155517 A * | 6/1994 | ............. B29C 45/14 |
| JP | 9-199880 A | 7/1997 | |

(Continued)

OTHER PUBLICATIONS

[NPL-1] Nakano et al. (JP H06-155517 A); dated Jun. 3, 1994 (EPO—machine translation to English). (Year: 1994).*

(Continued)

*Primary Examiner* — David Sample
*Assistant Examiner* — Donald M Flores, Jr.
(74) *Attorney, Agent, or Firm* — Birch, Stewart, Kolasch & Birch, LLP

(57) ABSTRACT

A heat conductive sheet comprising a cured product layer of a heat conductive silicone composition on one or both surfaces of a glass cloth sealed using a cured product of a heat conductive resin composition. The heat conductive silicone composition includes an organic silicon compound component and an aspherical heat conductive filler. The amount of the heat conductive filler is 250 to 600 parts by mass with respect to 100 parts by mass of the organic silicon compound component, and the heat conductive filler has a DOP oil absorption of not more than 80 ml/100 g. The heat conductive sheet can be continuously manufactured by coating molding and wound into a roll even with the use of an inexpensive aspherical heat conductive filler, and has high heat conductivity, low thermal contact resistance, and high insulating properties.

10 Claims, No Drawings

(56) References Cited

FOREIGN PATENT DOCUMENTS

| JP | 2007-59877 A | 3/2007 | |
|---|---|---|---|
| JP | 2012-131682 A | 7/2012 | |
| JP | 2015-233104 A | 12/2015 | |
| WO | WO-2015190270 A1 * | 12/2015 | ............... C08K 7/18 |

OTHER PUBLICATIONS

[NPL-2] Kashida et al. (JP H01-173514 A); dated Jul. 10, 1989 (EPO—machine translation to English). (Year: 1989).*
[NPL-3] Shin-Etsu "Thermal Interface Silicone Rubber"; Dec. 2017 Edition, pp. 3-5, <https://www.shinetsusilicone-global.com/catalog/pdf/tc_e.pdf>. (Year: 2017).*
International Search Report, issued in PCT/JP2017/021498, dated Aug. 22, 2017.
Written Opinion of the International Searching Authority, issued in PCT/JP2017/021498, dated Aug. 22, 2017.

* cited by examiner

HEAT CONDUCTIVE SHEET

TECHNICAL FIELD

The present invention relates to a heat-conductive sheet. More particularly, the invention relates to a heat-conductive sheet for use as a heat transfer material that can be interposed between a heat-generating electronic component and a heat-dissipating member such as a heat sink.

BACKGROUND ART

Given current trends toward higher functionality, higher speeds, smaller sizes and higher integration, the transistors, diodes and other semiconductor devices that are used in electronic equipment such as converters and power supplies have come to generate large amounts of heat themselves. The temperature of the equipment rises owing to such heat, triggering malfunctions and breakdowns. To address this problem, many heat-dissipating methods for suppressing temperature rises by semiconductor devices during operation, and heat-dissipating members to be used for this purpose, have been described.

For example, heat sinks that employ aluminum, copper or other metal plates having a high thermal conductivity are used to hold down the temperature rise by semiconductor devices during operation in electronic equipment. Such a heat sink carries away the heat generated by the semiconductor device and discharges the heat from a surface by utilizing the temperature difference with outside air. At the same time, the semiconductor device and the heat sink must be electrically insulated from each other. A plastic film or the like is placed between the heat-generating electronic component and the heat sink for this purpose. However, because plastic film has an exceedingly low thermal conductivity, it greatly hinders heat transfer to the heat sink. Also, in cases where a semiconductor device such as a transistor is fastened with screws to the heat sink, the screws must pass through the plastic film. Holes are formed in the film for this purpose, but such holes can lead to tearing of the film, making it impossible to maintain the electrically insulating properties. The inability to maintain the insulating properties is lethal to transistors and diodes.

To help prevent tearing and impart heat conductivity, heat-conductive sheets composed of a glass cloth with a heat-conductive resin laminated thereon have been developed. One example is a heat-conductive sheet made up of a glass cloth having laminated thereon a silicone rubber that contains boron nitride powder and spherical silica powder as heat-conductive fillers (Patent Document 1: JP-A H9-199880). During production, this sheet is subjected to applied pressure. In order to apply pressure, it is necessary to prepare a sheet of a suitable size and to use a pressing machine or the like. Because this is a batch production process, the completed heat-conductive sheet cannot be taken up into a roll, which is very inefficient from the standpoint of productivity and yield. Moreover, there are limitations on the size of the original sheet, which also imposes constraints on the size of the heat-conductive sheet during device packaging.

Continuous forming processes are exemplified by coating methods. For example, a heat-conductive sheet can be continuously produced by formation that involves sealing one side of a glass cloth with a heat-conductive silicone resin and then coating the sealed glass cloth with a layer of heat-conductive silicone rubber. In such a coating operation, the completed sheet can be continuously taken up, making production highly efficient. Also, even though the sheet width in the transverse direction is limited by the size of the coating machine, because there are no limitations on the sheet length in the machine direction, the degree of freedom in the size of the sheet during device packaging increases greatly compared with pressing. However, compared with pressing, a coating operation gives a poor surface precision, resulting in increased contact thermal resistance. Also, because pressure is not applied, the density of the silicone rubber layer tends not to increase. Hence, coating is unsuitable as a method for producing sheet having a high heat conductivity.

One way to achieve a good surface precision even with a coating process is the method of using a spherical heat-conductive filler to improve the flowability of the heat-conductive silicone resin. However, the grades of spherical heat-conductive fillers are limited, and there are various problems with each grade. For example, spherical alumina is relatively inexpensive, but because it has a high hardness, abrasion of the mixing tank arises during compounding, making maintenance of the production facilities more difficult and lowering the electrical insulating properties of the product. Agglomerated spherical powders such as aluminum nitride and boron nitride also exist, but these are very expensive, increasing the production costs of the heat-conductive sheet.

As for non-spherical heat-conductive fillers such as aluminum hydroxide which have relatively low material costs and possess electrical insulating properties, a drawback is that, because they have a large specific surface area and the amount in which such fillers can be loaded into silicone resin is limited, the thermal conductivity is low. Also, given that such fillers have a poor flowability, good surface precision is not obtained by coating and the contact thermal resistance worsens.

PRIOR ART DOCUMENTS

Patent Documents

Patent Document 1: JP-A H09-199880

SUMMARY OF INVENTION

Technical Problem

It is therefore an object of this invention is to provide a heat-conductive sheet which uses an inexpensive non-spherical heat-conductive filler, which can be continuously produced by a coating process and taken up into a roll, and which moreover has a high thermal conductivity, a low contact thermal resistance and high electrical insulating properties.

Solution to Problem

The inventors have conducted extensive investigations in order to achieve this object. As a result, they have discovered that, in a heat-conductive sheet which is made of a glass cloth that is sealed with a cured heat-conductive resin composition and has on one or both sides thereof a cured layer of a heat-conductive silicone composition, by having the heat-conductive silicone composition include specific amounts of an organosilicon compound component and a non-spherical heat-conductive filler having a specific DOP oil absorption, a heat-conductive sheet endowed with a high heat conductivity, a low contact thermal resistance and high electrical insulating properties can be produced by continuous forming.

Accordingly, the invention provides the following heat-conductive sheet.

[1]

A heat-conductive sheet having a glass cloth sealed with a cured heat-conductive resin composition and, on one or both sides of the sealed glass cloth, a cured layer of a heat-conductive silicone composition, wherein the heat-conductive silicone composition includes an organosilicon compound component and a non-spherical heat-conductive filler, the amount of the heat-conductive filler being from 250 to 600 parts by weight per 100 parts by weight of the organosilicon compound component and the heat-conductive filler having a DOP oil absorption of 80 mL/100 g or less.

[2]

The heat-conductive sheet of [1], wherein the non-spherical heat-conductive filler in the heat-conductive silicone composition is aluminum hydroxide powder.

[3]

The heat-conductive sheet of [2], wherein the aluminum hydroxide powder includes:

(1) from 100 to 500 parts by weight of an aluminum hydroxide powder having an average particle size of from 5 to 14 μm and a DOP oil absorption of 50 mL/100 g or less, and (2) from 50 to 400 parts by weight of an aluminum hydroxide powder having an average particle size of from 0.5 to 3 μm and a DOP oil absorption of 80 mL/100 g or less; with (1) accounting for at least 40 wt % of the overall amount of non-spherical heat-conductive filler.

[4]

The heat-conductive sheet of any of [1] to [3], wherein the non-spherical heat-conductive filler in the heat-conductive silicone composition has an amount of particles at least 45 μm in size of from 0 to 0.5 wt % and an amount of particles at least 75 μm in size of from 0 to 0.01 wt %.

[5]

The heat-conductive sheet of any of [1] to [4], wherein the organosilicon compound component in the heat-conductive silicone composition includes:

(A) an organopolysiloxane of the average compositional formula (1) below $$R^1_a SiO_{(4-a)/2} \quad (1)$$

(wherein each $R^1$ is independently a substituted or unsubstituted monovalent hydrocarbon group of 1 to 10 carbon atoms, and the subscript a is from 1.90 to 2.05) which has at least two silicon-bonded alkenyl groups per molecule.

[6]

The heat-conductive sheet of [5], wherein the organosilicon compound component in the heat-conductive silicone composition further includes:

(D) one or more selected from the group consisting of
   (D1) alkoxysilanes of formula (2) below $$R^2_b R^3_c Si(OR^4)_{4-b-c} \quad (2)$$

(wherein each $R^2$ is independently an alkyl group of 6 to 15 carbon atoms, each $R^3$ is independently a substituted or unsubstituted monovalent hydrocarbon group of 1 to 12 carbon atoms, each $R^4$ is independently an alkyl group of 1 to 6 carbon atoms, b is an integer from 1 to 3, c is 0, 1 or 2, and the sum b+c is from 1 to 3), and (D2) dimethylpolysiloxanes of formula (3) below

[Chem. 1]

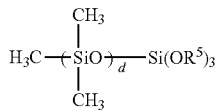

(3)

(wherein each $R^5$ is independently an alkyl group of 1 to 6 carbon atoms, and d is an integer from 5 to 100) that are capped at one end with a trialkoxysilyl group.

[7]

The heat-conductive sheet of [6], wherein the amount of component (D) is from 0.01 to 30 wt % of the total amount of the organosilicon compound component in the heat-conductive silicone composition.

[8]

The heat-conductive sheet of any of [1] to [7], wherein the glass cloth layer has a thickness of 60 μm or less and the heat-conductive sheet has an overall thickness which is from 130 to 900 μm when the sheet has a cured layer of heat-conductive silicone composition on both sides of the sealed glass cloth, and from 80 to 500 μm when the sheet has a cured layer of heat-conductive silicone composition on one side of the sealed glass cloth.

[9]

The heat-conductive sheet of any of [1] to [8], wherein the cured heat-conductive silicone composition has a thermal conductivity of at least 1.2 W/m·K.

[10]

The heat-conductive sheet of any of [1] to [9], wherein the cured heat-conductive silicone composition has a Durometer A hardness of from 60 to 96.

[11]

The heat-conductive sheet of any of [1] to [10], wherein the thermal resistance at a total sheet thickness of 0.2 mm, as measured in accordance with ASTM D5470 at 50° C. and 100 psi, is 2.5 cm²·K/W or less.

[12]

The heat-conductive sheet of any of [1] to [11], wherein the dielectric breakdown voltage in air at a total sheet thickness of 0.2 mm, as measured in accordance with JIS K6249, is at least 4 kV.

Advantageous Effects of Invention

The heat-conductive sheet of the invention can be continuously produced by coating and taken up into a roll, and moreover has a high heat conductivity and high electrical insulating properties.

DESCRIPTION OF EMBODIMENTS

The heat-conductive sheet of the invention has a layer of cured heat-conductive silicone composition (sometimes referred to below as a "heat-conductive cured layer") on one or both sides of a glass cloth sealed with a cured heat-conductive resin composition.

The heat-conductive silicone composition includes an organosilicon compound component and a non-spherical heat-conductive filler, the amount of the heat-conductive filler being from 250 to 600 parts by weight per 100 parts by weight of the organosilicon compound component, and the heat-conductive filler having a DOP oil absorption of 80 mL/100 g or less.

The non-spherical heat-conductive filler included in the heat-conductive silicone composition of the invention may be one that is commonly used, examples of which include nonmagnetic metals such as copper and aluminum; metal oxides such as alumina, silica, magnesia, red iron oxide, beryllia, titania and zirconia; metal nitrides such as aluminum nitride, silicon nitride and boron nitride; metal hydroxides such as magnesium hydroxide; and synthetic diamond and silicon carbide. These may be used singly or two or more may be used in combination.

The non-spherical heat-conductive filler has a DOP oil absorption of 80 mL/100 g or less, preferably 60 mL/100 g or less. When the DOP oil absorption exceeds this upper limit, the ability of the heat-conductivity filler to be loaded into the organosilicon compound component decreases, the flowability during coating is lost and the smoothness of the sheet surface is compromised, leading to a rise in thermal resistance. Also, a high loading of the heat-conductive filler becomes difficult to achieve, which is disadvantageous in terms of heat conductivity. The DOP oil absorption is preferably at least 10 mL/100 g. The DOP oil absorption is the amount of oil (di-2-ethylhexyl phthalate) that is needed to achieve a stiff, putty-like state when the heat-conductive filler is worked together with the oil. Measurement of the DOP oil absorption can be carried out by the DOP spatula rub-out method (in general accordance with JIS K 5101-13-1).

The content of non-spherical heat-conductive filler in the heat-conductive silicone composition is from 250 to 600 parts by weight, preferably from 300 to 570 parts by weight, and more preferably from 400 to 550 parts by weight, per 100 parts by weight of the organosilicon compound component. At a content of the non-spherical heat-conductive filler below this lower limit, sufficient heat conductivity is not obtained. At a content in excess of this upper limit, addition of the filler to the organosilicon compound component becomes difficult. Even when such addition is possible, the heat-conductive filler becomes too dense, leading to, when a heat-conductive sheet is obtained by coating the composition onto the glass cloth, a loss of smoothness of the sheet surface and a rise in thermal resistance.

The non-spherical heat-conductive filler has an amount of particles at least 45 μm in size that is preferably from 0 to 0.5 wt %, and more preferably from 0 to 0.2 wt %, and has an amount of particles at least 75 μm in size that is preferably from 0 to 0.01 wt %, and more preferably 0 wt %. At an amount of particles at least 45 μm in size and an amount of particles at least 75 μm in size which exceed these limits, when a heat-conductive sheet is obtained by coating the heat-conductive silicone composition onto the glass cloth, the heat-conductive filler may protrude from the surface of the applied film, compromising the smoothness of the sheet surface. This invites a rise in the contact thermal resistance at the time of device packaging, which is disadvantageous in terms of heat conductivity.

The amount of particles at least 45 μm in size and the amount of particles at least 75 μm in size within the non-spherical heat-conductive filler are determined in the following way. Ten grams of the heat-conductive filler is sampled and then placed in a given amount of water and ultrasonically dispersed. Screens with opening sizes of 45 μm and 75 μm are placed on top of one another and set in a sieve shaker, and the heat-conductive filler dispersed in water is charged into the sieve shaker. The heat-conductive filler remaining on each screen is dried and weighed.

Taking into overall account such considerations as heat conductivity, electrical insulating properties, specific gravity, fire retardance and cost, the non-spherical heat-conductive filler is preferably aluminum hydroxide. In particular, when the non-spherical heat-conductive filler is composed of:

(1) an aluminum hydroxide powder having an average particle size of from 5 to 14 μm, preferably from 5 to 12 μm, an amount of particles at least 45 μm in size of from 0 to 0.5 wt %, preferably from 0 to 0.2 wt %, an amount of particles at least 75 μm in size of from 0 to 0.1 wt %, preferably 0 wt %, and a DOP oil absorption of 50 mL/100 g or less, preferably 40 mL/100 g or less, and (2) an aluminum hydroxide powder having an average particle size of from 0.5 to 3 μm, preferably from 0.5 to 2 μm, an amount of particles at least 45 μm in size of from 0 to 0.5 wt %, preferably from 0 to 0.2 wt %, an amount of particles at least 75 μm in size of from 0 to 0.1 wt %, preferably 0 wt %, and a DOP oil absorption of 80 mL/100 g or less, preferably 60 mL/100 g or less, with the amount of component (1) being from 100 to 500 parts by weight, preferably from 150 to 400 parts by weight, the amount of component (2) being from 50 to 400 parts by weight, preferably from 80 to 300 parts by weight (the sum of the non-spherical heat-conductive fillers being as described above), and component (1) accounting for preferably at least 40 wt %, more preferably at least 50 wt %, of the total amount of the non-spherical heat-conductive filler, it is possible to achieve a high loading of the heat-conductive filler in the silicone resin, enabling the surface of the heat-conductive sheet that is formed to be made even smoother while achieving a high thermal conductivity. The upper limit in the proportion of component (1) in the overall amount of the non-spherical heat-conductive filler is preferably 90 wt % or less, and more preferably 83 wt % or less.

The non-spherical heat-conductive filler can be obtained by, for example, mixing together above components (1) and (2).

The average particle size in this invention is a volume-based value determined using the Microtrac MT-3300EX (Nikkiso Co., Ltd.), a laser diffraction scattering-type particle size analyzer.

The heat-conductive silicone composition is not particularly limited, provided it includes an organosilicon compound component and the above-described non-spherical heat-conductive filler, although it preferably includes components (A) to (C) below, and more preferably includes components (A) to (D):

(A) an organopolysiloxane of the average compositional formula (1) below:

$$R^1_a SiO_{(4-a)/2} \quad (1)$$

(wherein each $R^1$ is independently a substituted or unsubstituted monovalent hydrocarbon group of 1 to 10 carbon atoms, and the subscript a is from 1.90 to 2.05) which has at least two silicon-bonded alkenyl groups per molecule), (B) a curing agent, (C) the above-described non-spherical heat-conductive filler, and (D) one or more selected from the group consisting of (D1) and (D2) below:

(D1) alkoxysilanes of formula (2) below

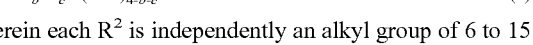

$$R^2_b R^3_c Si(OR^4)_{4-b-c} \quad (2)$$

(wherein each $R^2$ is independently an alkyl group of 6 to 15 carbon atoms, each $R^3$ is independently a substituted or unsubstituted monovalent hydrocarbon group of 1 to 12 carbon atoms, each $R^4$ is independently an alkyl group of 1 to 6 carbon atoms, b is an integer from 1 to 3, c is 0, 1 or 2, and the sum b+c is from 1 to 3), and (D2) dimethylpolysiloxanes of formula (3) below

[Chem. 2]

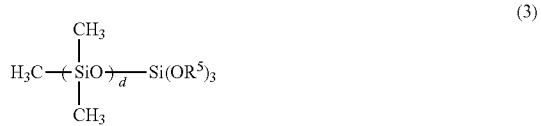

(3)

(wherein each $R^5$ is independently an alkyl group of 1 to 6 carbon atoms, and d is an integer from 5 to 100) that are capped at one end with a trialkoxysilyl group.

The heat-conductive silicone composition of the invention preferably includes component (A) described below as the organosilicon compound component.

Component (A) is an organopolysiloxane of the average compositional formula (1) below

$R^1_a SiO_{(4-a)/2}$ (1)

(wherein each $R^1$ is independently a substituted or unsubstituted monovalent hydrocarbon group of 1 to 10 carbon atoms, preferably from 1 to 8 carbon atoms, and the subscript a is from 1.90 to 2.05) which has at least two silicon-bonded alkenyl groups per molecule.

In formula (1), $R^1$ is exemplified by alkyl groups such as methyl, ethyl, propyl, butyl, pentyl, hexyl, heptyl, octyl, nonyl and decyl groups; cycloalkyl groups such as cyclopentyl and cyclohexyl groups; aryl groups such as phenyl, tolyl, xylyl and naphthyl groups; aralkyl groups such as benzyl, phenethyl and 3-phenylpropyl groups; halogenated alkyl groups such as 3,3,3-trifluoropropyl and 3-chloropropyl groups; and alkenyl groups such as vinyl, allyl, butenyl, pentenyl and hexenyl groups.

Component (A) may be in the form of an oil or a gum.

Component (A) has an average degree of polymerization of preferably from 20 to 12,000, and more preferably from 50 to 10,000. In this invention, the average degree of polymerization can be determined as a polystyrene-equivalent value in gel permeation chromatography (GPC) using, for example, toluene or tetrahydrofuran (THF) as the developing solvent. Generally, the average degree of polymerization can be determined as the number-average degree of polymerization or the like (the same applies below).

Component (A) is an ingredient which is cured by an addition reaction or with a peroxide. It has at least two, preferably at least three, silicon-bonded alkenyl groups per molecule. The amount of alkenyl groups is preferably from 0.0002 to 0.5 mol/100 g. At a silicon-bonded alkenyl group content smaller than this range, when curing is carried out by an addition reaction, the resulting composition does not fully cure.

The alkenyl groups are preferably vinyl groups. The alkenyl groups may be bonded to either silicon atoms at the ends of the molecular chain or to silicon atoms other than those at the ends of the molecular chain. It is preferable for at least one alkenyl group to be bonded to a silicon atom at an end of the molecular chain.

Specific examples of component (A) in cases where curing is carried out by an addition reaction include dimethylsiloxane-methylvinylsiloxane copolymers capped at both ends of the molecular chain with trimethylsiloxy groups, methylvinylpolysiloxanes capped at both ends of the molecular chain with trimethylsiloxy groups, dimethylsiloxane-methylvinylsiloxane-methylphenylsiloxane copolymers capped at both ends of the molecular chain with trimethylsiloxy groups, dimethylpolysiloxanes capped at both ends of the molecular chain with dimethylvinylsiloxy groups, methylvinylpolysiloxanes capped at both ends of the molecular chain with dimethylvinylsiloxy groups, dimethylsiloxane-methylvinylsiloxane copolymers capped at both ends of the molecular chain with dimethylvinylsiloxy groups, dimethylsiloxane-methylvinylsiloxane-methylphenylsiloxane copolymers capped at both ends of the molecular chain with dimethylvinylsiloxy groups, and dimethylpolysiloxanes capped at both ends of the molecular chain with trivinylsiloxy groups. These may be used singly or two or more may be used in combination.

Specific examples of component (A) in cases where curing is carried out using a peroxide include dimethylpolysiloxanes capped at both ends of the molecular chain with dimethylvinylsiloxy groups, dimethylpolysiloxanes capped at both ends of the molecular chain with methylphenylvinylsiloxy groups, dimethylsiloxane-methylphenylsiloxane copolymers capped at both ends of the molecular chain with dimethylvinylsiloxy groups, dimethylsiloxane-methylvinylsiloxane copolymers capped at both ends of the molecular chain with dimethylvinylsiloxy groups, dimethylsiloxane-methylvinylsiloxane copolymers capped at both ends of the molecular chain with trimethylsiloxy groups, methyl(3,3,3-trifluoropropyl)polysiloxanes capped at both ends of the molecular chain with dimethylvinylsiloxy groups, dimethylsiloxane-methylvinylsiloxane copolymers capped at both ends of the molecular chain with silanol groups, and dimethylsiloxane-methylvinylsiloxane-methylphenylsiloxane copolymers capped at both ends of the molecular chain with silanol groups. These may be used singly or two or more may be used in combination.

In cases where curing is carried out by an addition reaction, the reaction is carried out using an organohydrogenpolysiloxane as the curing agent (B) and in the presence of a platinum catalyst. In cases where curing is carried out with a peroxide, an organic peroxide is used as the curing agent (B).

Here, in cases where the composition is cured by an addition reaction (hydrosilylation reaction), the curing agent included is one that is made up of an organohydrogenpolysiloxane having an average at least two silicon-bonded hydrogen atoms per molecule and a platinum catalyst.

The silicon-bonded groups in this organohydrogenpolysiloxane are exemplified by linear alkyl groups, branched alkyl groups, cyclic alkyl groups, aryl groups, aralkyl groups and halogenated alkyl groups. Alkyl groups and aryl groups are preferred, with methyl and phenyl groups being especially preferred. This organohydrogenpolysiloxane has a kinematic viscosity at 25° C., as measured with an Ostwald viscometer, which, although not limited, is preferably in the range of 5 to 300 $mm^2/s$, and more preferably in the range of 10 to 200 $mm^2/s$. This organohydrogenpolysiloxane has a molecular structure which is not limited, and is exemplified by linear structures, branched structures, linear structures with some branching, cyclic structures and dentrimer structures. The organohydrogenpolysiloxane may be, for example, homopolymers having these molecular structures, copolymers made up of these molecular structures, or mixtures thereof.

Examples of such organohydrogenpolysiloxanes include dimethylpolysiloxanes capped at both ends of the molecular chain with dimethylhydrogensiloxy groups, dimethylsiloxane-methylhydrogensiloxane copolymers capped at both ends of the molecular chain with trimethylsiloxy groups, dimethylsiloxane-methylhydrogensiloxane copolymers capped at both ends of the molecular chain with dimethylhydrogensiloxy groups, organosiloxane copolymers consisting of siloxane units of the formula $(CH_3)_3SiO_{1/2}$, siloxane units of the formula $(CH_3)_2HSiO_{1/2}$ and siloxane units of the formula $SiO_{4/2}$, and mixtures of two or more thereof.

In this composition, the content of this organohydrogenpolysiloxane is the amount required to cure the composition. Specifically, the content is such that the amount of silicon-bonded hydrogen atoms in this component per mole of silicon-bonded alkenyl groups in component (A) is preferably in the range of 0.8 to 10 moles, more preferably in the range of 1 to 8 moles, and most preferably in the range of 1.2 to 5 moles. When the content of this component is an amount below the lower limit of this range, curing is inadequate, as a result of which a sufficient sheet strength may not be obtained or oil bleeding may be promoted. When the content exceeds the upper limit of this range, the sheet may become brittle or foaming may arise.

The platinum catalyst is a catalyst for promoting curing of this composition. Illustrative examples include chloroplatinic acid, alcohol solutions of chloroplatinic acid, olefin complexes of platinum, alkenyl siloxane complexes of platinum, and carbonyl complexes of platinum.

In this composition, the content of the platinum catalyst is the amount required to cure the composition. Specifically, it is desirable for the catalyst content to be such that the amount of platinum metal in this component, in weight units relative to component (A), is preferably from 0.1 to 2,000 ppm, and more preferably from 10 to 1,000 ppm. At a content of this component below the lower limit of this range, curing is inadequate, as a result of which a sufficient sheet strength may not be obtained or oil bleeding may be promoted. At a content in excess of the upper limit of this range, the sheet may become brittle or foaming may arise.

In cases where the composition cures via an organic peroxide-induced free radical reaction, the curing agent is an organic peroxide. Examples of the organic peroxide include benzoyl peroxide, di(p-methylbenzoyl) peroxide, di(o-methylbenzoyl) peroxide, dicumyl peroxide, 2,5-dimethyl-2,5-bis(t-butylperoxy)hexane, di-t-butyl peroxide and t-butyl peroxybenzoate.

The content of this organic peroxide is the amount required to cure the composition. Specifically, the content is preferably from 0.5 to 30 parts by weight, and more preferably from 1 to 20 parts by weight, per 100 parts by weight of component (A). At a content of this component below the lower limit of this range, curing is inadequate, as a result of which a sufficient sheet strength may not be obtained or oil bleeding may be promoted. At a content in excess of the upper limit of this range, the sheet may become brittle or foaming may arise.

The heat-conductive silicone composition of the invention includes as component (C) the above-described non-spherical heat-conductive filler. The amount of component (C) used is as described above.

The heat-conductive silicone composition of the invention may additionally include, as an organosilicon compound component, component (D) described below.

Component (D) is one or more selected from the group consisting of components (D1) and (D2) below. Component (D) improves the wettability of the non-spherical heat-conductive filler (C) and makes it easy to load the heat-conductive filler into the organosilicon compound component, thereby enabling the content of the heat-conductive filler to be increased.

Component (D1) is an alkoxysilane of formula (2) below.

$$R^2{}_bR^3{}_cSi(OR^4)_{4-b-c} \quad (2)$$

(wherein each $R^2$ is independently an alkyl group of 6 to 15 carbon atoms, each $R^3$ is independently a substituted or unsubstituted monovalent hydrocarbon group of 1 to 12 carbon atoms, each $R^4$ is independently an alkyl group of 1 to 6 carbon atoms, b is an integer from 1 to 3, c is 0, 1 or 2, and the sum b+c is from 1 to 3).

In formula (2), the alkyl group represented as $R^2$ is exemplified by hexyl, octyl, nonyl, decyl, dodecyl and tetradecyl groups. By having the number of carbon atoms on this alkyl group represented by $R^2$ be from 6 to 15, the wettability of the non-spherical heat-conductive filler (C) increases sufficiently, making it easy to load the heat-conductive filler into the heat-conductive silicone composition, in addition to which the low-temperature properties of the composition improve.

The substituted or unsubstituted monovalent hydrocarbon group of 1 to 12 carbon atoms represented by $R^3$ is exemplified by alkyl groups such as methyl, ethyl, propyl, isopropyl, butyl, isobutyl, t-butyl, pentyl, neopentyl, hexyl, heptyl, octyl, nonyl, decyl and dodecyl groups; cycloalkyl groups such as cyclopentyl, cyclohexyl and cycloheptyl groups; aryl groups such as phenyl, tolyl, xylyl, naphthyl and biphenylyl groups; aralkyl groups such as benzyl, phenylethyl, phenylpropyl and methylbenzyl groups; and any of these groups in which some or all hydrogen atoms are substituted with halogen atoms such as fluorine, chlorine or bromine or with cyano groups, illustrative examples of which include chloromethyl, 2-bromoethyl, 3-chloropropyl, 3,3,3-trifluoropropyl, chlorophenyl, fluorophenyl, cyanoethyl and 3,3,4,4,5,5,6,6,6-nonafluorohexyl groups. $R^3$ is preferably a monovalent hydrocarbon group of from 1 to 10 carbon atoms, and more preferably from 1 to 6 carbon atoms. Substituted or unsubstituted alkyl groups of 1 to 3 carbon atoms such as methyl, ethyl, propyl, chloromethyl, bromoethyl, 3,3,3-trifluoropropyl and cyanoethyl groups, and substituted or unsubstituted phenyl groups such as phenyl, chlorophenyl and fluorophenyl groups are especially preferred.

The alkyl group represented by $R^4$ is exemplified by alkyl groups of 1 to 6 carbon atoms, such as methyl, ethyl, propyl, butyl, pentyl and hexyl groups.

Component (D2) is a dimethylpolysiloxane of formula (3) below

[Chem. 3]

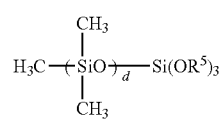

(3)

(wherein each $R^5$ is independently an alkyl group of 1 to 6 carbon atoms, and d is an integer from 5 to 100, preferably from 10 to 50) which is capped at one end of the molecular chain with a trialkoxysilyl group.

The alkyl group represented by $R^5$ is exemplified in the same way as the alkyl group represented by $R^4$ in formula (2).

When component (D) is included, the content thereof is preferably from 0.01 to 30 wt %, and more preferably from 5 to 20 wt %, of the total amount of organosilicon compound components. At a content below this lower limit, it may be difficult to load the non-spherical heat-conductive filler (C) into the organosilicon compound component. At a content in excess of this upper limit, the strength of the resulting cured product may be inadequate.

Here, "total amount of the organosilicon compound components" refers to the sum of the amounts of component (A) and, where present, component (D), the subsequently described component (E) and the organohydrogenpolysiloxane serving as the above-described curing agent (B).

The heat-conductive silicone composition of the invention may additionally include component (E) below as an organosilicon compound component. Component (E), which is a plasticizer, is a dimethylsiloxane of formula (4) below

[Chem. 4]

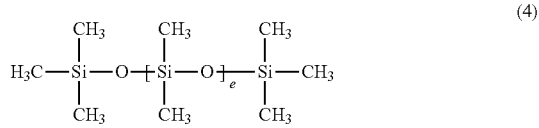

(4)

(wherein 3 is an integer from 5 to 500, preferably an integer from 50 to 400).

When component (E) is included, the content thereof is preferably from 0.5 to 20 wt %, and more preferably from 1 to 15 wt %, of the total amount of the organosilicon compound component. At a content below this lower limit, the sheet may have a higher hardness and become brittle. At a content in excess of this upper limit, a sufficient sheet strength may not be obtained or oil bleeding may be promoted.

The heat-conductive silicone composition can be prepared as follows. Components (A) and (C), along with components (D) and (E) when these are included, are mixed using a mixer such as a kneader, a Banbury mixer, a planetary mixer or a Shinagawa mixer while optionally heating at a temperature of 100° C. or more. In this mixing step, reinforcing silicas such as fumed silica and precipitated silica; silicone oils, silicone wetting agents, etc.; and flame retardants such as platinum, titanium oxide and benzotriazole may be added where desired. The uniform mixture obtained in the mixing step is cooled to room temperature, following which it is filtered by being passed through a strainer or the like. Next, using a two-roll mill, a Shinagawa mixer or the like, the required amount of curing agent (B) is added to this mixture, and mixing is again carried out. In this second mixing step, if desired, an acetylene compound-type addition reaction regulator such as 1-ethynyl-1-cyclohexanol, a colorant such as an organic pigment or an inorganic pigment, a heat resistance improver such as iron oxide or cerium oxide, and an internal mold release agent may be added. The heat-conductive silicone composition thus obtained may be directly furnished to the next step as a coating material, although a solvent such as toluene may also be added if necessary.

In curing via an addition reaction, the curing conditions for this heat-conductive silicone composition are preferably set to from 80 to 180° C., and especially from 100 to 160° C., for a period of from 30 seconds to 20 minutes, and especially from 1 to 10 minutes. In curing with an organic peroxide, the conditions are preferably set to from 100 to 180° C., and especially from 110 to 170° C., for a period of from 30 seconds to 20 minutes, and especially from 1 to 10 minutes.

The cured form of the heat-conductive silicone composition has a thermal conductivity of preferably at least 1.2 W/m·K, more preferably at least 1.5 W/m·K, and even more preferably at least 1.8 W/m·K. The thermal conductivity can be measured using the TPS-2500S from Kyoto Electronics Manufacturing Co., Ltd.

Also, the cured form of the heat-conductive silicone composition has a Durometer A hardness of preferably from 60 to 96, and more preferably from 70 to 96. When the hardness is too low, the surface of the cured layer readily scratches during handling, or mutually adjoining surfaces of the cured layer may fuse to one another when the heat-conductive sheet is taken up into a roll during continuous forming. Also, when the heat-conductive sheet of the invention is fastened by screws between a heat-generating site and a cooling site in a piece of electronic equipment, at a low hardness, the sheet deforms under the pressure applied by screw fastening, making it difficult to secure a space between the heat-generating site and the cooling site, which may in turn make it difficult to maintain the electrical insulating properties. On the other hand, at a hardness that is too high, the flexibility is poor, and so there is a possibility of the sheet breaking when it is bent.

The heat-conductive sheet of the invention has, on one or both sides of a glass cloth sealed with a cured heat-conductive resin composition, a cured layer of the above heat-conductive silicone composition (heat-conductive cured layer).

Here, the glass cloth used may be one that is commercially available. For example, use can be made of one having a weight of at least 5 g/m² but not more than 30 g/m². The glass cloth has a thickness of preferably not more than 60 μm, more preferably from 30 to 50 μm, and even more preferably from 30 to 45 μm. Because glass cloth has a relatively low thermal conductivity, when a high heat conductivity is desired, it is preferable for the glass cloth to be thin. However, if it is too thin, the strength decreases.

The heat-conductive resin composition for sealing the glass cloth is not particularly limited, although one having a thermal conductivity of at least 1.2 W/m·K is preferred.

The heat-conductive resin composition used for sealing is exemplified by compositions obtained by adding a heat-conductive filler to a thermoset resin, such as compositions which include components (A) to (C) of the above-described heat-conductive silicone composition. Here, the amount of non-spherical heat-conductive filler (C) added is preferably from 200 to 2,000 parts by weight per 100 parts by weight of the sum of the organosilicon compound components. When the amount of heat-conductive filler added is below this lower limit, it may be difficult to set the thermal conductivity of the sealing material to at least 1.2 W/m·K. The particle size of the non-spherical heat-conductive filler (C) is not particularly limited. The heat-conductive resin composition for sealing may be the same as the above-described heat-conductive silicone composition.

When the heat-conductive silicone composition obtained as described above is used as the sealing material, a sealed glass cloth is obtained by continuously applying this composition onto glass cloth using a conventional coating apparatus such as a comma coater, knife coater or kiss coater equipped with a drying oven, a heating oven and a take-up device, subsequently drying/evaporating off the solvent, etc. and then, in the case of curing by an addition reaction, heating at from about 80° C. to about 180° C., preferably from about 100° C. to about 160° C., for a period of from 30 seconds to 20 minutes, especially from 1 to 10 minutes, or, in the case of curing with a peroxide, heating at from about 100° C. to about 180° C., preferably from about 110° C. to about 170° C., for a period of from 30 seconds to 20 minutes, especially from 1 to 10 minutes.

Sealing is carried out such that the thickness of the sheet obtained by sealing the glass cloth (which sheet is referred to here as the "sealed glass cloth sheet") is preferably not more than 100 µm, more preferably not more than 90 µm, and even more preferably at least 35 µm and not more than 85 µm. When trying to produce the heat-conductive sheet to a predetermined thickness, if the sealed glass cloth sheet has a thickness that is too large, the thickness of the heat-conductive cured layer becomes small, which lowers the heat conductivity of the heat-conductive sheet.

As subsequently described, the heat-conductive sheet of the invention is obtained by coating and curing the heat-conductive silicone composition on one or both sides of the sealed glass cloth sheet so as to form a layer (or layers) of the cured composition. Such coating is carried out such that the thickness of the layer of cured composition after it has cured is preferably at least 50 µm and not more than 400 µm, and more preferably at least 60 µm and not more than 350 µm. As described above, when the thickness of the cured layer is too small, the heat-conductive filler included therein protrudes, compromising the smoothness at the surface of the heat-conductive cured layer.

The heat-conductive sheet of the invention is continuously produced by coating the heat-conductive silicone composition onto one or both sides of a sealed glass cloth sheet and forming a heat-conductive cured layer (or layers). The heat-conductive cured layer is formed by, for example, continuously applying the heat-conductive silicone composition obtained as described above onto one side (referred to here as "the front side") of a sealed glass cloth using a conventional coating apparatus such as a comma coater, knife coater or kiss coater equipped with a drying oven, a heating oven and a take-up device, subsequently drying/evaporating off the solvent, etc. and then, in the case of curing by an addition reaction, heating at from about 80° C. to about 180° C., preferably from about 100° C. to about 160° C., for a period of from 30 seconds to 20 minutes, especially from 1 to 10 minutes, or, in the case of curing with a peroxide, heating at from about 100° C. to about 180° C., preferably from about 110° C. to about 170° C., for a period of from 30 seconds to 20 minutes, especially from 1 to 10 minutes. When coating is carried out on both sides, the heat-conductive sheet is obtained by forming a heat-conductive cured layer on the other side (referred to here as the "back side") of the glass cloth as well in the same way as on the front side. Coating on the front side and coating on the back side may be carried out at one time. The completed heat-conductive sheet is continuously taken up into a roll. The heat-conductive silicone compositions that form the heat-conductive cured layers on the front and back sides may be mutually the same or may be different.

The heat-conductive sheet thus obtained has an overall sheet thickness which, when the sheet has a heat-conductive cured layer on both sides of the sealed glass cloth, is preferably from 130 to 900 µm, and more preferably from 150 to 800 µm, and when the sheet has a heat-conductive cured layer on one side only, is preferably from 80 to 500 µm, and more preferably from 90 to 450 µm.

The heat-conductive cured layer has a thickness of preferably at least 50 µm. When the thickness of the heat-conductive cured layer is less than 50 µm, the non-spherical heat-conductive filler included in the heat-conductive cured layer protrudes from the surface, compromising the surface smoothness. As a result, the heat conductivity decreases.

It is desirable for the heat-conductive sheet thus obtained to have a thermal resistance at a total sheet thickness of 0.2 mm which, when measured in accordance with ASTM D5470 at 50° C. and 100 psi, is preferably not more than 2.5 cm²·K/W, and more preferably not more than 2.3 cm²·K/W. Also, it is desirable for the dielectric breakdown voltage in air at a total sheet thickness of 0.2 mm, as measured in accordance with JIS K6249, to be preferably at least 4 kV, and more preferably at least 6 kV. The thermal resistance and dielectric breakdown voltage in air are substantially proportional to the thickness of the heat-conductive sheet.

EXAMPLES

The invention is illustrated more fully below by way of Examples and Comparative Examples, although the invention is not limited by these Examples.

The materials used in the Examples and Comparative Examples were as follows. Component (A):

(A1) A dimethylpolysiloxane having an average degree of polymerization of 8,000 and capped at both ends with dimethylvinyl groups (A2) A dimethylpolysiloxane having an average degree of polymerization of 3,000 and capped at both ends with dimethylvinyl groups Component (B): 2-Methylbenzoyl peroxide Component (C):

(C1) Irregularly shaped (non-spherical) aluminum hydroxide having an average particle size of 9.3 µm, an amount of particles at least 45 µm in size of 0.04 wt %, an amount of particles at least 75 µm in size of 0 wt %, and a DOP oil absorption of 30 mL/100 g (C2) Irregularly shaped (non-spherical) aluminum hydroxide having an average particle size of 1.3 µm, an amount of particles at least 45 µm in size of 0.06 wt %, an amount of particles at least 75 µm in size of 0 wt %, and a DOP oil absorption of 50 mL/100 g (C3) (for comparison) Irregularly shaped (non-spherical) aluminum hydroxide having an average particle size of 8.2 µm, an amount of particles at least 45 µm in size of 0.06 wt %, an amount of particles at least 75 µm in size of 0 wt %, and a DOP oil absorption of 90 mL/100 g (C4) (for comparison) Irregularly shaped (non-spherical) aluminum hydroxide having an average particle size of 1.2 µm, an amount of particles at least 45 µm in size of 0.06 wt %, an amount of particles at least 75 µm in size of 0 wt %, and a DOP oil absorption of 130 mL/100 g Component (D): A dimethylpolysiloxane of formula (5) below having an average degree of polymerization of 30 and capped at one end with a trimethoxysilyl group

[Chem. 5]

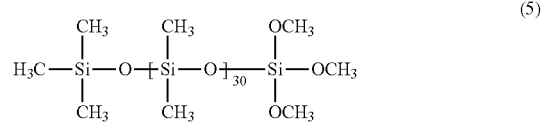

Component (E): A dimethylpolysiloxane of formula (6) below

[Chem. 6]

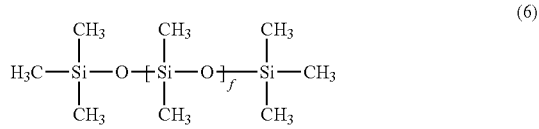

(6)

to (wherein f=300)

Glass Cloth: Thickness, 40 μm; weight, 26 g/m$^2$

Examples 1 to 4 and Comparative Examples 1 to 3

[Preparation of Heat-Conductive Silicone Compositions]

Heat-Conductive Silicone Compositions (a) to (e) were prepared by charging the ingredients in the amounts (parts by weight) shown in Table 1 into a Banbury mixer and mixing for 20 minutes.

The thermal conductivities and hardnesses of the resulting heat-conductive silicone compositions in their cured forms were measured by the following methods. The results are shown in Table 1.

Thermal Conductivity

Using a 60 mm×60 mm×6 mm mold, the resulting silicone composition was pressed at 160° C. for 10 minutes under a pressure adjusted so that the thickness after curing becomes 6 mm, and was cured as a 6 mm-thick sheet. Using a thermal conductivity meter (available under the trade name TPS-2500S from Kyoto Electronics Manufacturing Co., Ltd.), the probe was inserted between two such sheets and the thermal conductivity of the sheets was measured.

Hardness

Using a 60 mm×60 mm×6 mm mold, the resulting silicone composition was pressed at 160° C. for 10 minutes under a pressure adjusted so that the thickness after curing becomes 6 mm, and was cured as a 6 mm-thick sheet. Two such sheets were placed on top of one another to form a test specimen and the hardness was measured with a type A durometer.

[Production of Heat-Conductive Sheet]

Sealing of Glass Cloth

A coating material was prepared by using as the sealing composition the heat-conductive silicone composition shown in Table 2 and obtained as described above, adding to this 50 wt % (based on the weight of the composition) of toluene, and mixing in a planetary mixer. This coating material was applied to one side of a glass cloth using a comma coater, thereby sealing the glass cloth. The comma coater used had a width of 1,300 mm and an effective oven length of 15 meters. The 15-meter oven was divided into three zones of 5 meters each, and arranged so that the temperature can be separately adjusted for each zone. The temperature settings, from the side closest to the comma portion, were 80° C., 140° C. and 170° C. The coating rate was 2 m/min. The coating material was continuously applied onto the glass cloth and taken up, thereby giving a sealed glass cloth. The sealed glass cloth had a thickness of 80 μm.

Coating onto Sealed Glass Cloth

A coating material prepared by adding, to the heat-conductive silicone composition shown in Table 2 and obtained as described above, 40 wt % of toluene (based on the weight of the composition) and mixing in a planetary mixer was coated using a comma coater onto one side (front side) of the sealed glass cloth obtained above so as to give a thickness after curing of 60 μm, and then taken up. Next, the other side (back side) was similarly coated and then taken up, thereby giving a heat-conductive sheet having an overall thickness of 200 μm. The comma coater used and the coating conditions were the same as in the sealing step.

In Comparative Example 3, coating onto the sealed glass cloth was carried out as follows. The oven temperatures were set to, from the side closest to the comma portion, 60° C., 80° C. and 80° C., and the coating rate was set to 2 m/min. By lowering the oven temperature to a temperature that vaporizes the toluene and at which decomposition of the peroxide (B) does not arise, the product was obtained in an uncured state. This uncured product was cut to a suitable size and, using a pressing machine, the pressure was adjusted so as to give a thickness after curing of 200 μm and pressing was carried out at 170° C. for 10 minutes, giving a heat-conductive sheet.

The thermal resistance and dielectric breakdown voltage in air of the resulting heat-conductive sheet were measured by the following methods. The results are shown in Table 2.

Thermal Resistance

Measured in accordance with ASTM D5470 at 50° C. and 100 psi.

Dielectric Breakdown Voltage in Air

Measured in accordance with JIS K6249.

TABLE 1

| Ingredients (pbw) | | Composition | | | | |
|---|---|---|---|---|---|---|
| | | (a) | (b) | (c) | (d) | (e) |
| Component (A) | (A1) | 100 | 70 | 70 | 100 | 100 |
| | (A2) | 0 | 20 | 20 | 0 | 0 |
| Component (B) | | 15 | 15 | 15 | 20 | 15 |
| Component (C) | (C1) | 315 | 350 | 0 | 100 | 100 |
| | (C2) | 135 | 150 | 0 | 100 | 800 |
| | (C3) (for comparison) | 0 | 0 | 350 | 0 | 0 |
| | (C4) (for comparison) | 0 | 0 | 150 | 0 | 0 |
| Component (C) (total amount) | | 450 | 500 | 500 | 200 | 900 |
| Component (D) | | 10 | 10 | 10 | 10 | 15 |
| Component (E) | | 0 | 10 | 10 | 0 | 0 |
| Amount of component (C) (pbw) per 100 pbw of combined amount of organosilicon compound components ((A) + (D) + (E)) | | 409 | 455 | 455 | 182 | 783 |

TABLE 1-continued

| Ingredients (pbw) | Composition | | | | |
|---|---|---|---|---|---|
| | (a) | (b) | (c) | (d) | (e) |
| Measurement results | | | | | |
| Thermal conductivity (W/m · K) | 1.8 | 2.1 | 1.9 | 0.8 | could not be compounded |
| Durometer A hardness | 81 | 78 | 83 | 75 | |

TABLE 2

| | Example | | | | Comparative Example | | |
|---|---|---|---|---|---|---|---|
| | 1 | 2 | 3 | 4 | 1 | 2 | 3 |
| Sealing composition | (a) | (b) | (a) | (b) | (a) | (a) | (a) |
| Compositions for Front side heat-conductive cured layer | (a) | (b) | (a) | (b) | (d) | (c) | (c) |
| Back side | (a) | (b) | (b) | (a) | (d) | (c) | (c) |
| Measurement results | | | | | | | |
| Thermal resistance (cm² · K/W) | 2.13 | 1.76 | 1.96 | 1.88 | 2.96 | 2.69 | 1.75 |
| Dielectric breakdown voltage in air (kV) | 9 | 10 | 10 | 9 | 8 | 8 | 10 |

The heat-conductive sheets of the invention were continuously produced by coating and taken up into a roll. As is apparent from Table 2, when the total thickness was 0.2 mm, the sheet had a low thermal resistance of 2.5 cm²·K/W or less and a high dielectric breakdown voltage of at least 4 kV.

On the other hand, in the sheet obtained in Comparative Example 1, the amount of non-spherical heat-conductive filler (C) was lower than in the range of the invention, as a result of which the thermal resistance was large. Even in Comparative Example 2, in which C3 and C4 which have large DOP oil absorptions were used, wetting of the silicone by the non-spherical heat-conductive filler was inadequate, the smoothness of the sheet surface during coating was compromised and the thermal resistance rose. The sheet in Comparative Example 3 differed from that in Comparative Example 2 only in that pressing was carried out instead of coating. By pressing, a sheet having a small thermal resistance was obtained. However, with pressing, it is not possible to continuously produce the sheet and take it up into a roll.

In Table 1, the amount of non-spherical heat-conductive filler (C) in composition (e) was higher than the range of the invention. As a result, a smooth compound was not obtained, and so coating was not carried out.

The invention claimed is:
1. A heat-conductive sheet comprising a glass cloth sealed with a cured heat-conductive resin composition and, on one or both sides of the sealed glass cloth, a cured layer of a heat-conductive silicone composition, wherein
the heat-conductive silicone composition comprises an organosilicon compound component and a non-spherical heat-conductive filler, the amount of the non-spherical heat-conductive filler being from 250 to 600 parts by weight per 100 parts by weight of the organosilicon compound component and the non-spherical heat-conductive filler having a DOP oil absorption of 80 mL/100 g or less, and the non-spherical heat-conductive filler comprises:
(1) from 100 to 500 parts by weight per 100 parts by weight of the organosilicon compound component of an aluminum hydroxide powder having an average particle size of from 5 to 14 μm and a DOP oil absorption of 50 mL/100 g or less, and
(2) from 50 to 400 parts by weight per 100 parts by weight of the organosilicon compound component of an aluminum hydroxide powder having an average particle size of from 0.5 to 3 μm and a DOP oil absorption of 80 mL/100 g or less, wherein
an amount of the aluminum hydroxide powder having the average particle size of from 5 to 14 μm and the DOP oil absorption of 50 mL/100 g or less is at least 40 wt % based on the total amount of the non-spherical heat-conductive filler.

2. The heat-conductive sheet of claim 1, wherein the non-spherical heat-conductive filler in the heat-conductive silicone composition has an amount of particles at least 45 μm in size of from 0 to 0.5 wt % and an amount of particles at least 75 μm in size of from 0 to 0.01 wt %.

3. The heat-conductive sheet of claim 1, wherein the organosilicon compound component in the heat-conductive silicone composition comprises:
(A) an organopolysiloxane, which has at least two silicon-bonded alkenyl groups per molecule, represented by the following average compositional formula (1):

$$R^1_a SiO_{(4-a)/2} \quad (1)$$

wherein each $R^1$ is independently a substituted or unsubstituted monovalent hydrocarbon group of 1 to 10 carbon atoms, and the subscript a is from 1.90 to 2.05.

4. The heat-conductive sheet of claim 3, wherein the organosilicon compound component in the heat-conductive silicone composition further comprises (D) one or more selected from the group consisting of:
(D1) alkoxysilanes represented by the following formula (2):

$$R^2_b R^3_c Si(OR^4)_{4-b-c} \quad (2)$$

wherein each $R^2$ is independently an alkyl group of 6 to 15 carbon atoms, each $R^3$ is independently a substituted or unsubstituted monovalent hydrocarbon group of 1 to 12 carbon atoms, each $R^4$ is independently an alkyl group of 1 to 6 carbon atoms, b is an integer from 1 to 3, c is 0, 1 or 2, and the sum b+c is from 1 to 3; and (D2) dimethylpolysiloxanes, which are capped at one end with a trialkoxysilyl group, represented by the following formula (3):

(3)

wherein each $R^5$ is independently an alkyl group of 1 to 6 carbon atoms, and d is an integer from 5 to 100.

5. The heat-conductive sheet of claim 4, wherein the amount of component (D) is from 0.01 to 30 wt % of the total amount of the organosilicon compound component in the heat-conductive silicone composition.

6. The heat-conductive sheet of claim 1, wherein the glass cloth layer has a thickness of 60 μm or less and the heat-conductive sheet has an overall thickness which is from 130 to 900 μm when the sheet has the cured layer of heat-conductive silicone composition on both sides of the sealed glass cloth, and from 80 to 500 μm when the sheet has the cured layer of heat-conductive silicone composition on one side of the sealed glass cloth.

7. The heat-conductive sheet of claim 1, wherein the cured heat-conductive silicone composition has a thermal conductivity of at least 1.2 W/m·K.

8. The heat-conductive sheet of claim 1, wherein the cured heat-conductive silicone composition has a Durometer A hardness of from 60 to 96.

9. The heat-conductive sheet of claim 1, wherein a thermal resistance at a total heat-conductive sheet thickness of 0.2 mm, as measured in accordance with ASTM D5470 at 50° C. and 100 psi, is 2.5 cm²·K/W or less.

10. The heat-conductive sheet of claim 1, wherein a dielectric breakdown voltage in air at a total heat-conductive sheet thickness of 0.2 mm, as measured in accordance with JIS K6249, is at least 4 kV.

\* \* \* \* \*